United States Patent [19]

Baur

[11] Patent Number: 4,864,251

[45] Date of Patent: Sep. 5, 1989

[54] COMPENSATION CIRCUIT FOR POWER AMPLIFIER

[75] Inventor: Bruce K. Baur, Milwaukie, Oreg.

[73] Assignee: Tektronix, Inc., Beaverton, Oreg.

[21] Appl. No.: 270,906

[22] Filed: Nov. 14, 1988

[51] Int. Cl.$^4$ .............................................. H03G 3/30
[52] U.S. Cl. .................................... 330/285; 315/389
[58] Field of Search ................... 330/207 A, 251, 128, 330/285; 315/403, 404, 389, 408

[56] References Cited
FOREIGN PATENT DOCUMENTS 863463  2/1971  Canada ........................... 330/207 A Primary Examiner—James B. Mullins
Attorney, Agent, or Firm—William K. Bucher

[57] ABSTRACT

A base drive compensation circuit for a power amplifier samples a fixed saturation voltage level on the output of a power transistor and couples the sampled output to an inverting input of an error amplifier having a sawtooth signal on its non-inverting input. The output of the error amplifier is a negative going signal whose duty cycle is established by the voltage level on the inverting input. The negative going signal is coupled to a switching power supply that develops a voltage which controls the base drive current to the power transistor.

4 Claims, 2 Drawing Sheets

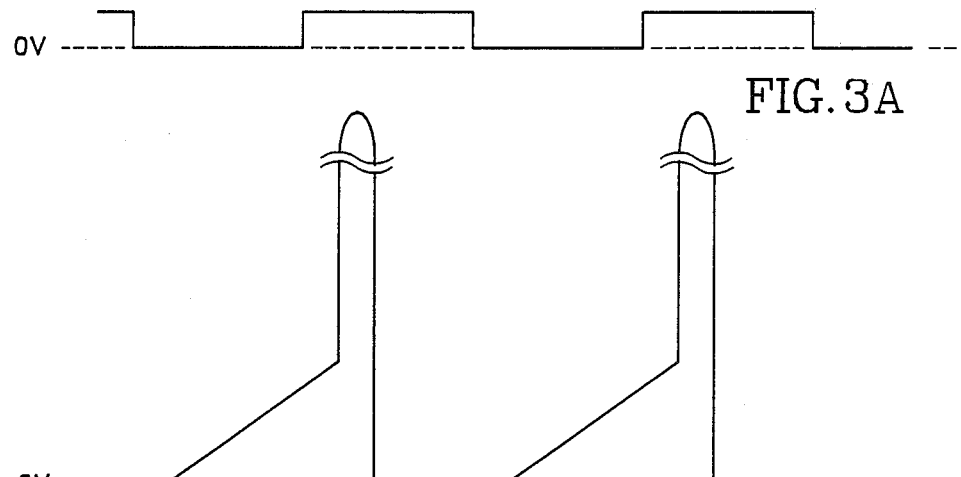
FIG. 3A
FIG. 3B
FIG. 3C
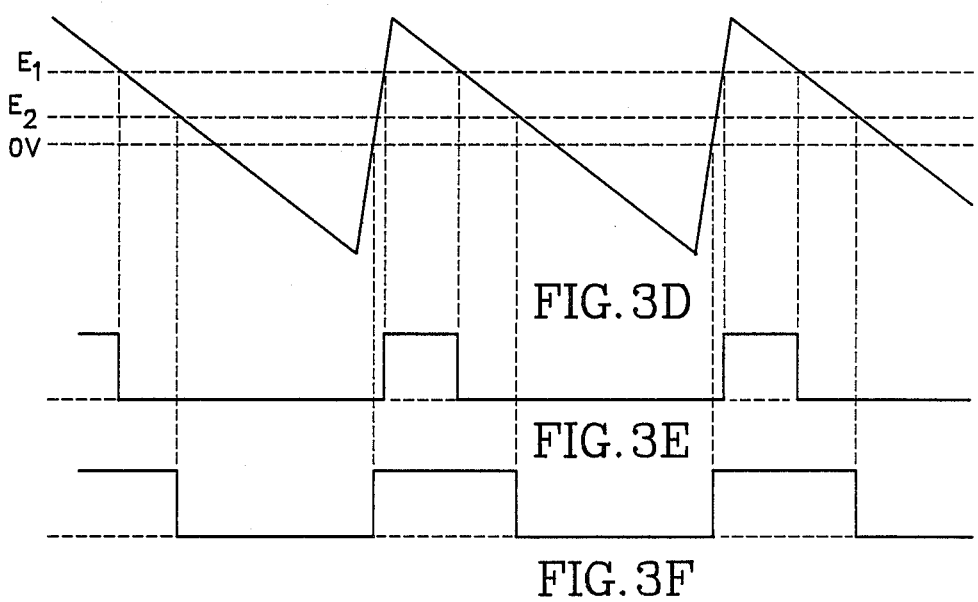
FIG. 3D
FIG. 3E
FIG. 3F

COMPENSATION CIRCUIT FOR POWER AMPLIFIER

BACKGROUND OF THE INVENTION

The present invention relates to a compensation circuit for a power amplifier and, in particular, to a compensation circuit for an output transistor in a flyback output circuit.

Power amplifiers designed to function as flyback output circuits typically operate as high current switching devices that drive inductive loads, such as a yoke mechanism of a horizontal deflection circuit of a display system employing a cathode ray tube. An output transistor in the flyback output circuit is coupled to receive an input current on its base electrode causing the transistor to conduct and to develop an induced storage charge in the base. A ramping saturation voltage is developed on the collector of the output transistor as current flow increases in the collector. A high, reverse current is applied to the base electrode to rapidly remove the storage charge on the base and turn the transistor off. Once the storage charge is removed from the base, the current flowing in the collector of the transistor drops to zero as the voltage on the collector spikes up to a high value, for example 4 KV. The voltage spike immediately falls in the negative direction until it is clamped just below zero volts by damping diodes in the flyback circuit.

During the time period when the collector current in the output transistor is dropping to zero and the voltage is spiking up, power is being dissipated in the transistor. Attempting to reduce the power consumption of the transistor by reducing the saturation voltage level on its collector by increasing the current into its base only succeeds in increasing the storage time and decreasing the switching speed of the transistor which increases the power consumption. Decreasing the input current to the base of the transistor increases the saturation voltage level on the collector which causes sweep non-linearity and, again, power consumption. There exists an optimum base drive current that will produce the maximum efficiency and speed for the output transistor by minimizing the power consumption and storage time.

It is very difficult at the present time to maintain an optimum base drive in a fixed flyback output circuit. Temperature changes, variations in the collector load, known as pincushion correction, variations in the beta of the output transistor from device to device along with component variations in the flyback output circuit affect the output saturation of the transistor. What is needed is a variable base drive circuit for the output transistor that maintains the maximum speed and efficiency of the transistor with respect to component and environmental changes.

SUMMARY OF THE INVENTION

In accordance with the present invention a base drive compensation circuit for a power amplifier samples and stores a portion of the saturation voltage level on the collector of an output transistor and compares the stored value with a reference to produce a correction value that varies an input current to a base electrode of the power transistor. Maintaining a fixed saturation voltage level where the efficiency is high by varying the base drive of the power transistor makes a first order correction for temperature changes, variations in the collector output, variations in the beta of the transistor from device to device, and variations in other components in the circuit.

In a preferred embodiment of the invention, the sampled and stored saturation voltage is compared with a negative going sawtooth signal in an error amplifier to vary the duty cycle of a negative going signal pulse at the output of the error amplifier. The negative pulse signal is coupled to a power supply that develops a voltage based on the duty cycle of the negative pulse signal established in the error amplifier. The voltage from the power supply is coupled to a base drive circuit that supplies a current to the base electrode of the output transistor which controls the saturation voltage level on the collector.

The objects, advantages and novel features of the present invention are apparent from the following detailed description when read in conjunction with the appended claims and attached drawings.

BRIEF DESCRIPTION OF THE DRAWINGS

FIGS. 3A-3F are representative waveforms at various locations in the base drive compensation circuit for the flyback output transistor.

DETAILED DESCRIPTION

Figure 1:
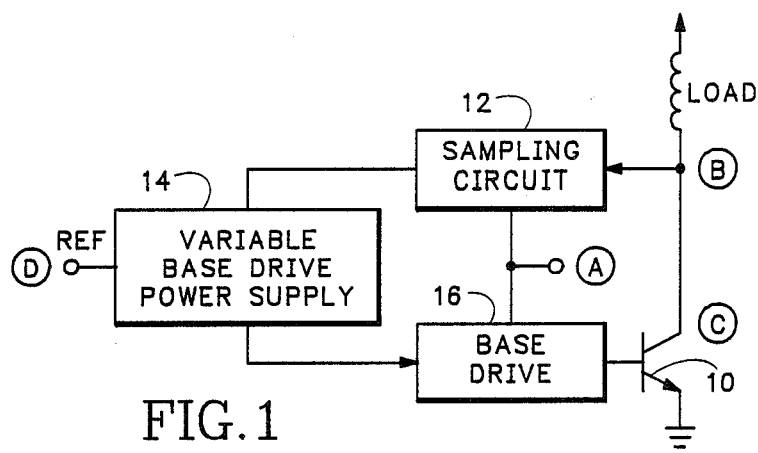
FIG. 1 is a block diagram of the compensation circuit for a power amplifier of the present invention.

Referring to FIG. 1, there is shown a block diagram of a compensation circuit for a power amplifier according to the present invention. An output transistor 10 has its collector coupled to a sampling circuit 12, such as a capacitor connected to a gating circuit, that stores a portion of the collector output during a certain interval. The output of the sampling circuit is coupled to a variable base drive power supply 14 that is also coupled to receive a reference signal. The reference signal is combined with the output of the sampling circuit 12 to produce a correction value representative of changes in the collector output. The correction value affects the variable base drive power supply 14 to produce an output that is coupled to the base circuit 16. The base drive circuit 16 responds to the output of the variable base power supply 14 to vary an input current to the output transistor 10 which, in turn, varies the saturation voltage level on the collector.

Figure 2:
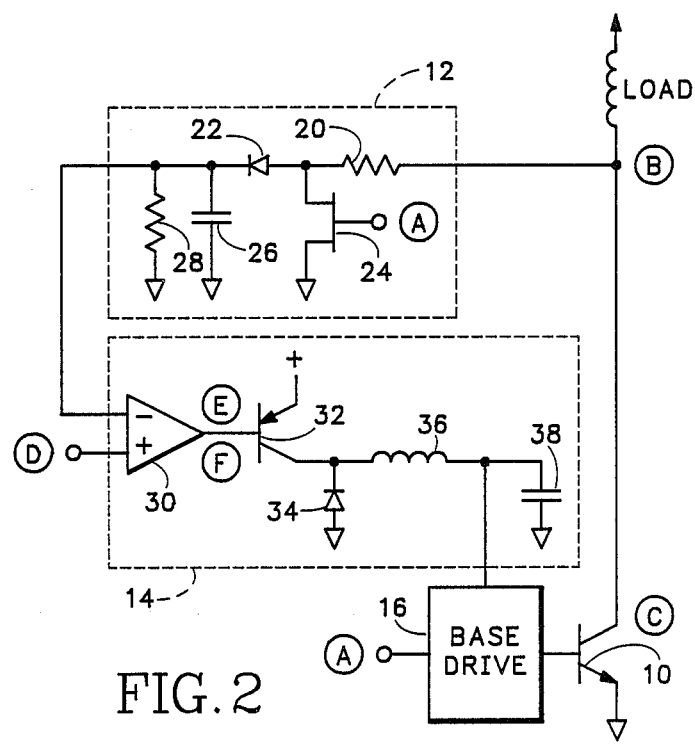
FIG. 2 is a schematic diagram of a base drive compensation circuit for a flyback output transistor incorporating the present invention.

FIG. 2 shows a schematic diagram of a base drive compensation circuit for a flyback output transistor incorporating the present invention. The voltage on the collector of output transistor 10 is coupled through resistor 20 in sampling circuit 12 to the anode of diode 22 and to the drain of a FET 24. The gate electrode of FET 24 is coupled to receive a gating pulse, such as the base drive signal for the output transistor, that turns FET 24 on and off for predetermined amounts of time. The cathode of diode 22 is connected to a capacitor 26, which is charged during the time FET 24 is off, and bleeder resistor 28. The opposite ends of capacitor 26 and resistor 28 are coupled to ground along with the source electrode of FET 24.

The stored charge on capacitor 26 is coupled to the inverting input of an error amplifier 30 in variable base drive power supply 14. A sawtooth signal is applied to the non-inverting input terminal of error amplifier 30.

The output of error amplifier 30 is a negative going pulse signal having a duty cycle established by the sampled voltage stored on capacitor 26. The error amplifier 30 output is coupled to the base of switching transistor 32 which is a part of a switching power supply made of the transistor, diode 34, inductor 36, and capacitor 38. The emitter of transistor 32 is coupled to a voltage source while the collector is coupled to ground through diode 34. One end of an inductor 36 is connected to the transistor 32 collector-diode 34 junction while the other end is connected to a capacitor 38. The other end of capacitor 38 is connected to ground. The output of the variable base drive power supply, in the form of the voltage on capacitor 38, is coupled to base drive circuit 16.

During operation, a negative going base drive signal, shown in FIG. 3A, is applied to the base drive 16 which generates a current to the base electrode of output transistor 10 based on the voltage coupled from the variable base drive power supply. The output transistor is driven into conduction which causes the current on its collector to ramp-up in a positive direction as is shown in FIG. 3C. Concurrently, the voltage through transistor 10 ramps-up in a positive direction as shown in FIG. 3B. When the base drive signal to base drive 16 goes positive, an induced storage charge in transistor 10, caused by current flow into the base, is discharged causing the transistor to shut off and the current through the transistor to drop to zero while the voltage on the collector spikes-up to approximately 1.4 KV. An example of a base drive for a power transistor may be found in co-pending patent application, Ser. No. 7/270,716, filed Nov. 14, 1988, by Bruce Baur, titled "High Speed Base Drive for a Power Amplifier".

During the time the base drive signal is low, FET 24 in sampling circuit 12 is off allowing current to flow through diode 22 and charge capacitor 26. Initially, diode 22 is reversed biased by the small negative voltage on the collector of output transistor 10. As the voltage on the collector ramps up during the conductive phase of transistor 10, diode 22 becomes forward biased and current flows into capacitor 26 charging it to a value based on the saturation voltage level of transistor 10. When the base drive signal goes high, FET 24 is turned on and functions as a current sink for the current flowing through resistor 20. As is shown in the waveforms in FIGS. 3A and 3B, the base drive signal, acting as the sampling gate, turns FET 24 on prior to the initiation of the high amplitude voltage spike on the collector of transistor 10. This limits the sampling period to the linear portion of the saturated voltage output of transistor 10. A resistor and shunt diode, not shown, may be added to the input of sampling circuit 12 to limit the high voltage spike from the collector of output transistor 10, as is well known in the art.

The voltage charge on capacitor 26, representative of the saturation voltage level on transistor 10, is coupled to the inverting input of the error amplifier 30. The non-inverting input of error amplifier 30 is coupled to receive a sawtooth signal, shown in FIG. 3D. The output of error amplifier 30 is a negative going pulse signal having a duty cycle determined by the voltage on the inverting input of the error amplifier. This relationship is shown in FIGS. 3E and 3F. The duty cycle of the negative going pulse signal varies with the change in the saturation voltage level of transistor 10 as sampled by the sampling circuit 12. The negative going pulse signal is coupled to the base of transistor 32. During the time transistor 32 conducts, current flows through the transistor and inductor 36 to charge capacitor 38. During the time transistor 32 is not conducting, the stored charge on inductor 36 causes continued current flow through diode 34 and inductor 36 to capacitor 38. The voltage charge on capacitor 38 is coupled to the base drive circuit 16 to control the amount of current applied to the base of the output transistor which in turn controls the voltage saturation level of the output transistor.

Any increase or decrease in the saturation voltage level of output transistor 10 is detected by the sampling circuit 12. Changes in the sampled saturation voltage, representatively shown as $E_1$ and $E_2$ in FIG. 3D, increases or decreases the duty cycle of the negative going pulse signal output from the error amplifier 30, respectively shown in FIGS. 3E and 3F, which changes the voltage output of the variable base drive power supply. The power supply voltage coupled to the base drive circuit 16 changes the base current into the output transistor 10 which in turn establishes the saturation voltage level on the collector. Any changes in the operating characteristics of the output transistor 10 from device to device or changes in component characteristics in the associated circuitry are automatically compensated for by the compensation circuit. In this way, the output transistor is maintained at an optimum operating level for best efficiency and fastest switching.

The use of a switching power supply as described is an efficient method for controlling the voltage level at the input of the base drive circuit 16 that supplies a current to the base electrode of the output transistor 10. A linear power supply may also be used to control the voltage at the input of base drive 16. In this implementation, the sampled saturation voltage from sampling circuit 12 is fed directly to the error amplifier of the linear power supply.

A compensation circuit for a power amplifier has been described where a fixed saturation voltage level on the output of the power transistor gives a first approximation of environmental and component changes in the circuit. By sampling the saturation voltage level and comparing it to a reference level, a correction value is produced that varies the input current to the base of the power transistor to optimize the transistor for maximum efficiency and speed. These and other aspects of the present invention are set forth in the appended claims.

I claim:

1. A base drive compensation circuit for a power amplifier circuit comprising:
   a transistor having an output coupled to said power amplifier and an input coupled to receive an input pulse for sampling a predetermined portion of a saturation voltage level from said power amplifier;
   a capacitor coupled to said output of said transistor to store said voltage level;
   means for generating a correction value from said sampled saturation voltage level and a reference value; and
   means responsive to said correction value for producing a base drive input to said power amplifier to maintain said saturation voltage level at a predetermined level.

2. The base drive compensation circuit of claim 1 wherein said generating means comprises:
   an error amplifier coupled to receive said sampled saturation voltage level at an inverting input and said reference at a non-inverting input to generate an output representative of said sampled saturation voltage level on said inverting input; and a power supply coupled to receive said output of said error amplifier to generate a variable voltage representative of the saturation voltage level of said power amplifier.

3. The error amplifier of claim 2 wherein said reference at said non-inverting input is a sawtooth signal and the output of said error amplifier is a negative going signal having a duty cycle determined by said sampled saturation voltage level on said inverting input.

4. The generating means of claim 2 wherein said power supply comprises:
   a transistor coupled to receive a negative going signal from said error amplifier, said transistor conducting during the negative portion of said signal;
   a capacitor coupled through a coil to the collector of said transistor, said capacitor charging when said transistor conducts; and
   a diode having a cathode coupled to the junction of said transistor collector and said coil and an anode coupled to a reference potential to provide a current path for said coil during the non-conductive cycle of said transistor.

* * * * *